United States Patent [19]

Okuyama

[11] Patent Number: 4,893,276
[45] Date of Patent: Jan. 9, 1990

[54] OUTPUT CIRCUIT OF A STATIC RANDOM ACCESS MEMORY CIRCUIT

[75] Inventor: Hiroaki Okuyama, Kyoto, Japan
[73] Assignee: Matsushita Electronics Corporation, Osaka, Japan
[21] Appl. No.: 277,195
[22] Filed: Nov. 29, 1988
[30] Foreign Application Priority Data Dec. 3, 1987 [JP] Japan ................................. 62-306345

[51] Int. Cl.[4] ............................................... G11C 7/00
[52] U.S. Cl. .............................. 365/189.08; 365/233.5
[58] Field of Search .................. 365/189, 189.08, 233.5

[56] References Cited

U.S. PATENT DOCUMENTS 4,570,091 2/1986 Yasuda et al. ........................ 307/583
4,724,340 2/1988 Sood ..................................... 307/443

Primary Examiner—James W. Moffitt
Attorney, Agent, or Firm—Wenderoth, Lind & Ponack

[57] ABSTRACT

An output circuit of a static random access memory is designed to set the output voltage of the data output circuit to an intermediate voltage by detecting the transition of the address signal before the data in a memory cell is read out from the memory cell, and then, the output voltage of the data output circuit is changed from the intermediate voltage to an H level or from the intermediate voltage to an L level. In this way, since the output voltage changes from the intermediate voltage to an H level or an L level, the transition time of the output voltage is shortened, and therefore the speed of a data reading operation may be increased. At the same time, the momentary current through the data output circuit may be decreased.

4 Claims, 3 Drawing Sheets

OUTPUT CIRCUIT OF A STATIC RANDOM ACCESS MEMORY CIRCUIT

BACKGROUND OF THE INVENTION

This invention relates to an output circuit of a static random access memory circuit (hereinafter called a SRAM).

FIG. 4 is an output circuit of a conventional SRAM, and FIG. 5 is a timing chart of the output circuit in FIG. 4.

In FIG. 4, multiple memory cells arranged in a matrix in a memory cell block (not shown) each contain "1" or "0" data, and when one memory cell is selected by an address signal AD, the "1" or "0" data stored in that memory cell is read out. If the data being read out is a "1", the internal data S in FIG. 4 becomes a high level (an H level) and the internal data $\bar{S}$ becomes a low level (an L level). On the contrary, if the data being read out is a "0", the internal data S in FIG. 4 becomes an L level and the internal data $\bar{S}$ becomes an H level. An output control circuit 2 controls the gates of MOS FETs $Q_1$ and $Q_2$ of a data output circuit 1 according to the potential levels of the internal data S and $\bar{S}$, and establishes the output Do at an H level or an L level. For example, when the internal data S is an H level and the internal data $\bar{S}$ is an L level (in other words, when the data stored in the selected memory cell is a "1"), both MOF FET gates $Q_1$ and $Q_2$ of the data output circuit 1 are set at an L level, and only the P-channel MOS FET $Q_1$ is turned on, and the output Do is pulled up to an H level. On the contrary, when the internal data S is an L level and the internal data $\bar{S}$ is an H level (in other words, when the data stored in the selected memory cell is a "0"), both MOS FET gates $Q_1$ and $Q_2$ of the data output circuit 1 are set to an H level, and only the N-channel MOS FET $Q_2$ is turned on, and the output Do is pulled down to an L level.

Therefore, when the address signal AD changes, the internal data S and $\bar{S}$ change from an H level to an L level or vice versa, and according to this change, the output control circuit 2 controls the gate potentials of MOS FETs $Q_1$ and $Q_2$ of the data output circuit 1, and the final output Do changes from an H level to an L level or vice versa. FIG. 5 shows such voltage changes.

In the conventional composition, however, the output Do changes largely from an H level ($\simeq$Vcc) to an L level ($\simeq$0 V), or from an L level ($\simeq$0 V) to an H level ($\simeq$Vcc). Generally, since the load connected to the output terminal of the SRAM has an extremely high capacity, if the potential change of the output Do is large, the transition time until the output Do settles at a stable value of an H level or an L level is long, and the reading operation of the SRAM cannot be increased in speed. Besides, since the output Do voltage changes by a large amount, a large momentary current flows through MOS FETs $Q_1$ and $Q_2$ of the output circuit 1.

SUMMARY OF THE INVENTION

It is hence a primary object of this invention to present an output circuit of a SRAM capable of operating the SRAM at high speed by shortening the transition time of the output potential.

It is a second object of this invention to present an output circuit of a SRAM having a reduced momentary current flowing through the MOS FET of the data output circuit.

Summing up, this invention is intended to set the output voltage of the data output circuit at an intermediate voltage by detecting the transition of an address signal before the data in the memory cell is read out, and then pulling up the output voltage of the data output circuit from the intermediate voltage to an H level or then pulling the output voltage down from the intermediate voltage to an L level, depending on the data being read out from the memory cell.

In this way, the output voltage always changes from the intermediate voltage to an H level or an L level, and the transition time of the output voltage may be shortened, and therefore, the reading speed of the SRAM may be increased. Furthermore, the momentary current flowing through the data output circuit can be reduced.

DETAILED DESCRIPTION OF THE INVENTION

Figure 1:
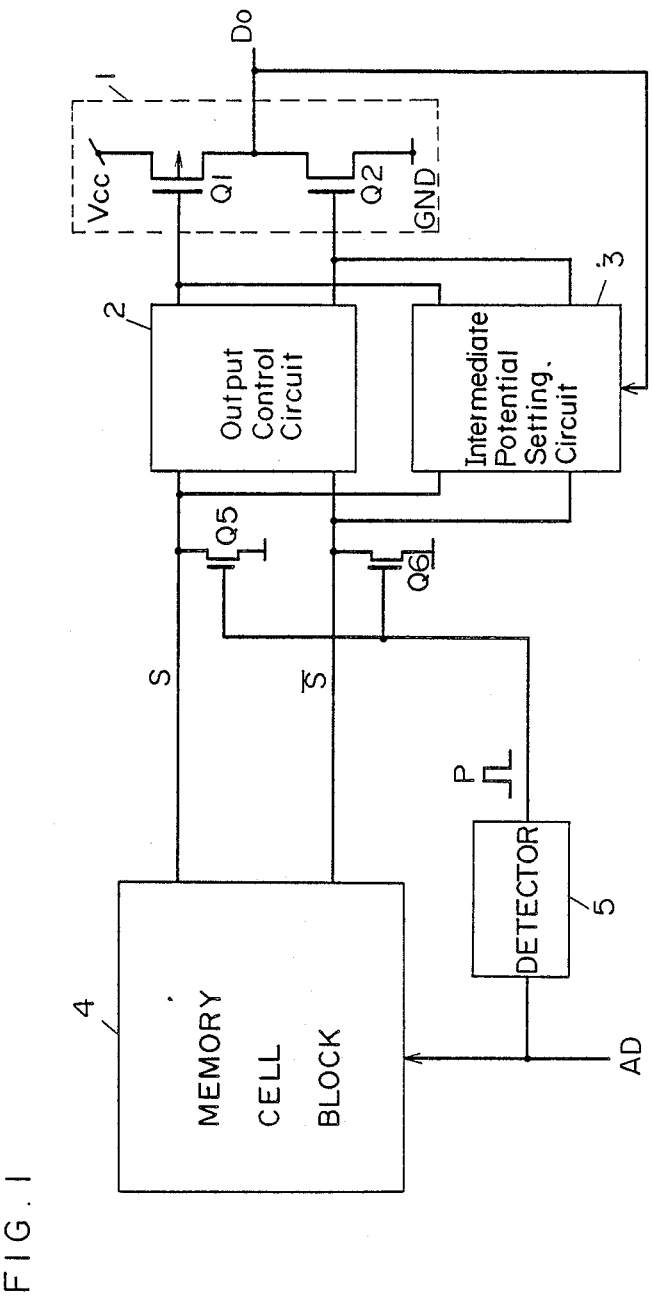
FIG. 1 is a block diagram of an output circuit of a SRAM in accordance with a more practical embodiment of the present invention.
Figure 2:
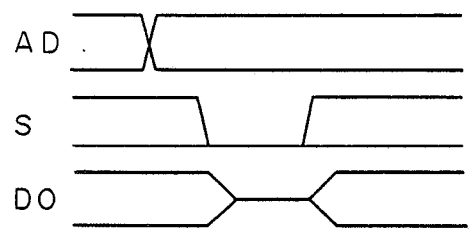
FIG. 2 is a timing chart of essential parts of FIG. 1.

Referring now to FIGS. 1 and 2, an embodiment of the invention is described below. In FIG. 1, a memory cell block 4 contains, among others, a memory cell matrix, an address decoder for selecting a memory cell in the memory cell matrix and a data reading circuit for reading out the data stored in each memory cell. In a fashion similar to that of the prior art, "1" or "0" data is read out from the memory cell (not shown) when selected by address signal AD. Depending on whether this data read out from the memory cell is a "1" or a "0", the internal data S and $\bar{S}$ become an H level or an L level. The data S and $\bar{S}$ are supplied to the output control circuit 2, and also to an intermediate potential or voltage setting circuit 3. On the other hand, MOS FETs $Q_5$ and $Q_6$ are connected between data wires of internal data S and $\bar{S}$ and a reference potential, and the pulse generated by an address transition detector 5 for detecting transitions of the address signal AD is supplied to the gates of the MOS FETs $Q_5$ and $Q_6$. Therefore, the internal data S and $\bar{S}$ both first change to an L level every time the address signal AD is changed, and thereafter they change to the level depending on the data in the selected memory cell. The output of the intermediate potential setting circuit 3 is supplied to the gates of the MOS FETs $Q_1$ and $Q_2$ of the data output circuit 1, together with the output of the output control circuit 2. The output Do of the data output circuit 1 is supplied to the intermediate potential setting circuit 3 in order to control the action of the intermediate potential setting circuit 3.

The operation of thus composed output circuit of a SRAM in accordance with this embodiment is explained below.

When a certain memory cell is selected by an address signal AD, the internal data S and $\bar{S}$ are determined depending on the data stored in that memory cell. Accordingly, depending on the internal data S and $\bar{S}$, the output control circuit 2 controls the on/off switching of MOS FETs $Q_1$ and $Q_2$ in the data output circuit 1, so that the output Do is established at an L level or an H level. At this time, the intermediate potential setting circuit 3 is in an inactive state.

Next, when the address signal AD is changed in order to select other memory cell, the address transition detector 5 instantly detects the transition of the address signal AD, and generates a detection pulse P. The detection pulse P is supplied to the gates of MOS FETs $Q_5$ and $Q_6$ to turn on both $Q_5$ and $Q_6$, thereby changing both internal data S and $\bar{S}$ to an L level. In this way, the internal data S and $\bar{S}$ change to an L level for a specific period before the internal data S and $\bar{S}$ change to the level corresponding to the data in the memory cell, so that the transition of the address signal AD may be detected. Thus, when the internal data S and $\bar{S}$ both become an L level, the intermediate potential setting circuit 3 is set in an active state. When the intermediate potential setting circuit 3 is placed in its active state, the output Do is an, if it is H level at that moment, lowered to to an intermediate voltage point. Or, if the output Do is an L level at that moment, the output Do is pulled up to the intermediate voltage point.

Afterwards, the data of the memory cell selected by the address signal AD is read out, and the internal data S and $\bar{S}$ change to an H level or an L level, when the intermediate potential setting circuit 3 is again placed in its inactive state, and thereafter the output control circuit 2 controls the on/off switching of MOS FETs $Q_1$ and $Q_2$ of the data output circuit 1 depending on the state of the internal data S and $\bar{S}$, and the output Do is changed from the intermediate voltage to an H level or from the intermediate voltage to an L level. FIG. 2 shows the changes of the address signal AD, data S, and output Do level at this time.

Thus, according to the embodiment in FIG. 1, after transition of the address signal AD, and before the levels of the internal data S and $\bar{S}$ are changed to the level corresponding to the data read out from the memory cell, the voltage level of the output Do is detected by the intermediate potential setting circuit 3 so that the output Do may be preliminarily set to an intermediate voltage. Therefore, afterwards, when the internal data S and $\bar{S}$ are changed to the level corresponding to the data read out from the memory cell, the output Do may be always changed from the intermediate voltage level to an H level or from the intermediate voltage level to an L level. Accordingly, the transition time of the output Do may be shortened, and high speed reading of the SRAM may be realized. It is also possible to reduce the momentary current flowing through MOS FETs $Q_1$ and $Q_2$ of the data output circuit 1.

Figure 3:
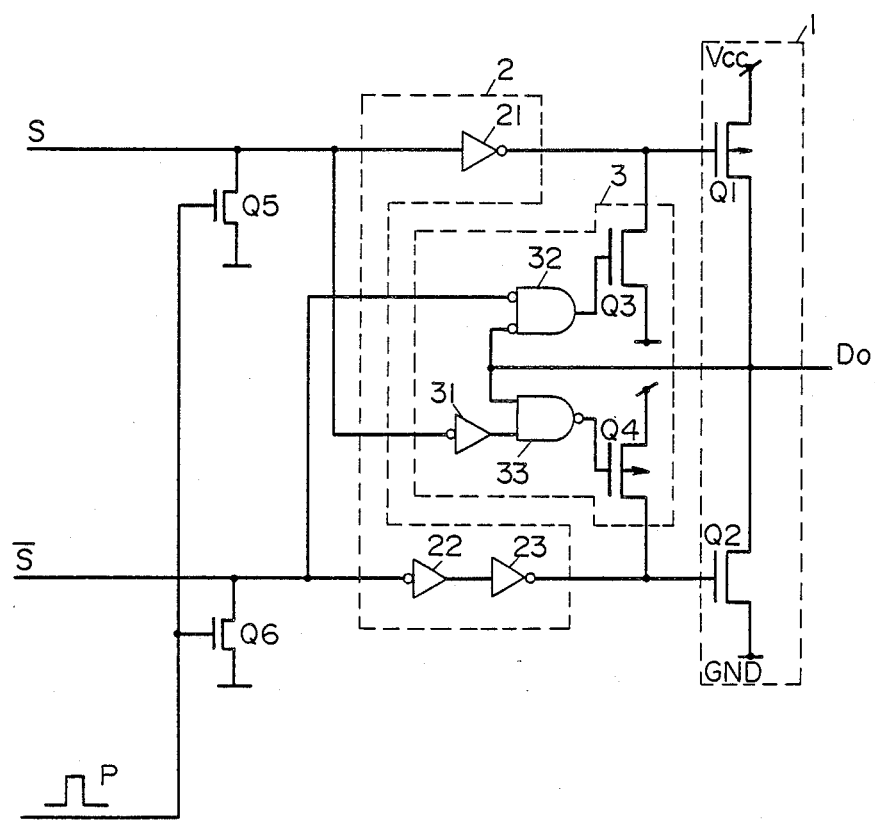
FIG. 3 is a block diagram of an output circuit system of SRAM in a more practical embodiment of the invention.
Figure 4:
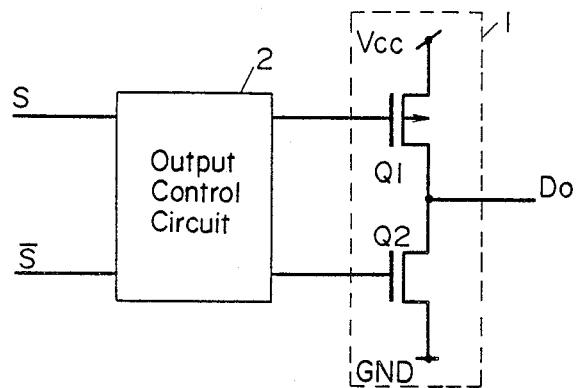
FIG. 4 is a block diagram of an output circuit of a conventional SRAM.
Figure 5:
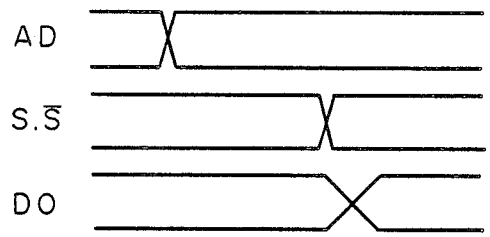
FIG. 5 is a timing chart of essential parts of FIG. 4.

FIG. 3 shows a more practical embodiment of this invention.

In FIG. 3, an output control circuit 2 is composed of inverters 21, 22, and 23. An intermediate potential setting circuit 3 is composed of an inverter 31, NOR gate 32, NAND gate 33, N-channel MOS FET $Q_3$, and P-channel MOS FET $Q_4$. The output Do of a data output circuit 1 is supplied to one of the input terminals of NOR gate 32, and NAND gate 33, respectively. The internal data S is supplied to the gate of the MOS FET $Q_1$ of the data output circuit 1 by way of the inverter 21 of the output control circuit 2, and is also supplied into the other input terminal of NAND gate 33 by way of the inverter 31 of the intermediate potential setting circuit 3. On the other hand, the internal data $\bar{S}$ is supplied to the gate of MOS FET $Q_2$ of the data output circuit 1 by way of the inverters 22 and 23 of the output control circuit 2, and is also supplied to the other input terminal of NOR gate 32 of the intermediate potential setting circuit 3. The outputs of the NOR gate 32 and NAND gate 33 are respectively supplied to the gates of MOS FETs $Q_3$ and $Q_4$. The source and drain of MOS FET $Q_3$ are respectively connected to the output terminal of the inverter 21 and a reference potential point, while the source and drain of MOS FET $Q_4$ are respectively connected to the supply voltage potential Vcc and the output terminal of the inverter 23.

The operation of the circuit shown in FIG. 3 is as follows.

When a certain memory cell is selected and a data "1" stored in that memory cell is read out, the internal data S is at an H level and the internal data $\bar{S}$ is at an L level, and the output Do is at an H level. At this time, the output of NOR gate 32 becomes an L level, and the MOS FET $Q_3$ is turned OFF. By contrast, the output of NAND gate 33 becomes an H level, and the MOS FET $Q_4$ is turned OFF. That is, the intermediate potential setting circuit 3 is in an inactive state, and the output Do is fixed at an H level. When the a data "0" stored in the memory cell is read out, the intermediate potential setting circuit 3 is in its inactive state in the same fashion as stated above, and the output Do is fixed at an L level.

Next, by the transition of the address signal AD, when another memory cell is accessed, the change of address signal AD is detected, and a detection pulse P is generated, and the MOS FETs $Q_5$ and $Q_6$ are both turned on, and the internal data S and $\bar{S}$ potentials are lowered to and L level. As a result, if the previous output Do is at an H level, the two inputs of the NAND gate 33 both become an H, and the output of the NAND gate 33 becomes an L level, and the MOS FET $Q_4$ is placed in its active state. On the other hand, the two inputs of the NOR gate 32 are respectively at an H level an L level, and the output of the NOR gate 32 is at an L level, and the MOS FET $Q_3$ remains in its OFF state. Therefore, the gate of MOS FET $Q_2$ of the data output circuit 1 becomes an H level, and the MOS FET $Q_2$ is placed in its active state, and the output Do is pulled down to the intermediate voltage between an H level and the reference potential (e.g.-GND). On the contrary, when the output Do before the generation of the detection pulse P is an L level, the MOS FET $Q_1$ of the data output circuit 1 is placed in its active state, and the MOS FET $Q_2$ is turned off, and the output Do is pulled up to the intermediate voltage between an L level and the supply potential (e.g.-Vcc).

In consequence, when "1" or "0" data is read out from the selected memory cell, the internal data, S and $\bar{S}$ are changed to an H level or an L level, and correspondingly the MOS FETs $Q_1$ and $Q_2$ of the data output circuit 1 are controlled in on/off switching, and the output Do is pulled up (or down) from the intermediate potential to an H level (or an L level).

According to the embodiment in FIG. 3, in this way, the transition of address signal AD is detected, and the potential of the output Do is preliminarily set at intermediate voltage, and then, when data is to be output at Do from the memory cell, the voltage is changed from the intermediate voltage to an H level or an L level, and therefore the transition time of the output Do is shortened, and high-speed reading is realized, and the momentary current flowing through the data output circuit may be decreased.

Incidentally, in the embodiments shown in FIG. 1 and FIG. 3, MOS FETs $Q_5$ and $Q_6$ are provided in order to detect the transition of the address signal, and the MOS FETs $Q_5$ and $Q_6$ are turned on by the address transition detection pulse P, and the internal data S and $\bar{S}$ are first changed to an L level, but this invention is not limited to this method alone. For example, it may be possible to connect the MOS FETs $Q_5$ and $Q_6$ between the wires of internal data S and $\bar{S}$ and the voltage supply (Vcc), and change the internal data S and $\bar{S}$ to an H level for a specific period. In this case, too, by only rearranging the logic gates of the intermediate potential setting circuit 3, the same operation as in the embodiment in FIG. 3 may be realized. Besides, instead of changing the internal data S and $\bar{S}$ to an L level or an H level for a specific period by the transition of address signal, a signal to express such a transition of the address signal (for example, the address transition detection pulse in FIG. 1 or FIG. 3) may be directly supplied to the intermediate potential setting circuit. In this case, again, the same operation as in the embodiment in FIG. 3 may be realized by only rearranging the logic gates.

We claim:

1. An output circuit of a static random access memory comprising:
   a memory cell block containing plural memory cells;
   output control means for receiving internal data changed depending on the data in any one of said plural memory cells selected by an address signal;
   data output means composed of P-channel and N-channel MOS FETs of which sources are connected to two supply potentials, in which an output signal of said output control means is applied to the gates of said P-channel and N-channel MOS FETs for on/off control, and an output potential at a connection point of the drains of said P-channel and N-channel MOS FETs is changed to a potential level corresponding to data in said selected memory cell; and
   intermediate potential setting means for setting said output potential of said data output means to an intermediate potential between an immediately preceding output potential of said data output means and one of said supply potentials, after a transition of said address signal and before a change of said internal data, on the basis of said transition of said address signal and said output potential of said data output means, in which
   said output control means changes said output potential of said data output means from said intermediate potential to a potential corresponding to data in said selected memory cell, after transition of said address signal and after change of said internal data.

2. An output circuit of a static random access memory according to claim 1, wherein internal data converting means for detecting the transition of said address signal and changing said internal data to an L level or an H level for a specific period is disposed at an input side of said output control means, and an output of said internal data converting means is supplied to said intermediate potential setting means.

3. An output circuit of a static random access memory according to claim 1, wherein a signal generated by detection of a transition of said address signal is directly applied into said intermediate potential setting circuit.

4. An output circuit of a static random access memory according to claim 1, wherein said intermediate potential setting circuit comprises:
   first switching means connected between a gate of one of said MOS FETs of said data output means and a first supply potential of lower potential; and
   second switching means connected between a gate of the other one of said MOS FETs of said data output means and a second supply potential of higher potential, in which
   when said address signal transitions while the output potential of said data output means is in an H level state, said second switching means is placed in its active state in order to activate the other one of said MOS FETs of said data output means, and an output potential of said data output means is set at an intermediate potential between the H level and said first supply potential, and when said address signal transitions while the output potential of said data output means is in an L level state, said first switching means is placed in its active state in order to activate said one of said MOS FETs of said data output means, and an output potential of said data output means is set at an intermediate potential between the L level and said second supply potential.

* * * * *